United States Patent
Murazawa et al.

(10) Patent No.: US 10,852,240 B2
(45) Date of Patent: Dec. 1, 2020

(54) FACET REGION DETECTING METHOD AND DETECTING APPARATUS

(71) Applicant: DISCO CORPORATION, Tokyo (JP)

(72) Inventors: Naoki Murazawa, Tokyo (JP); Kunimitsu Takahashi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/541,793

(22) Filed: Aug. 15, 2019

(65) Prior Publication Data

US 2020/0064269 A1 Feb. 27, 2020

(30) Foreign Application Priority Data

Aug. 22, 2018 (JP) ................. 2018-155654

(51) Int. Cl.
*G01N 21/00* (2006.01)
*G01N 21/64* (2006.01)
*C30B 33/00* (2006.01)
*G01N 1/28* (2006.01)
*C30B 29/36* (2006.01)

(52) U.S. Cl.
CPC ......... *G01N 21/6489* (2013.01); *C30B 29/36* (2013.01); *C30B 33/00* (2013.01); *G01N 1/286* (2013.01); *G01N 2001/2866* (2013.01)

(58) Field of Classification Search
CPC ............ H01L 41/22; G01N 2021/8477; G01N 21/21; G01N 21/65; G01N 2021/656
USPC ........................................................... 356/31
See application file for complete search history.

(56) References Cited

U.S. PATENT DOCUMENTS

| | | | |
|---|---|---|---|
| 2005/0076830 A1* | 4/2005 | Motoki | C30B 29/403 117/92 |
| 2008/0202409 A1* | 8/2008 | Motoki | C30B 29/403 117/84 |
| 2017/0098579 A1* | 4/2017 | Oba | H01L 33/00 |
| 2017/0136572 A1* | 5/2017 | Hirata | B23K 26/0876 |

FOREIGN PATENT DOCUMENTS

| JP | 2004323348 A | 11/2004 |
|---|---|---|
| JP | 2013100217 A | 5/2013 |
| JP | 2014040357 A | 3/2014 |
| JP | 2016127186 A | 7/2016 |

* cited by examiner

*Primary Examiner* — Md M Rahman
(74) *Attorney, Agent, or Firm* — Greer Burns & Crain Ltd.

(57) ABSTRACT

A facet region detecting method for detecting a facet region of an SiC single crystal ingot includes: an irradiation step of irradiating a first surface of the SiC single crystal ingot with light; a fluorescence intensity detection step of detecting the intensity of fluorescence generated from the first surface of the SiC single crystal ingot by the light; and a determination step of determining a region of the first surface where the fluorescence intensity is comparatively low as a facet region and determining a region where the fluorescence intensity is comparatively high as a non-facet region.

8 Claims, 5 Drawing Sheets

FACET REGION DETECTING METHOD AND DETECTING APPARATUS

BACKGROUND OF THE INVENTION

Field of the Invention

The present invention relates to a detecting method for detecting a facet region of a silicon carbide (SiC) single crystal ingot and a detecting apparatus for detecting the facet region.

Description of the Related Art

In recent years, attention has been paid to SiC in place of silicon (Si) as a next-generation semiconductor material to be used for power devices such as inverters and converters. An SiC wafer is formed by slicing an SiC single crystal ingot. As a method for manufacturing an SiC wafer by slicing the SiC single crystal ingot, there has been known, for example, a method in which the SiC single crystal ingot is sliced by use of a wire saw. However, the method using the wire saw has a problem that the amount of SiC lost is large, and the number of SiC wafers obtained is small as compared to the amount of the SiC single crystal ingot serving as a raw material. For example, at the time of manufacturing an SiC wafer with a thickness of approximately 350 μm, a region with a thickness of approximately 150 to 200 μm is necessary as a cutting allowance. Further, for removing undulation or the like from the surface of the SiC wafer obtained, the surface of the SiC wafer should be polished to remove a region with a thickness of approximately 50 μm.

In view of this, as a method for manufacturing an SiC wafer in which the loss of SiC is comparatively small, there has been known a method in which a laser beam of such a wavelength as to be transmitted through SiC is applied while setting a focal point in the inside of the SiC single crystal ingot, to form modified layers and cracks extending from the modified layers, thereby splitting the SiC single crystal ingot. In this method, the focal point of the laser beam is positioned at a predetermined depth position in the SiC single crystal ingot, and the laser beam is scanned along a split plane, to form the modified layers along the split plane (see Japanese Patent Laid-open No. 2016-127186).

Incidentally, an SiC single crystal is formed, in its growth process, with regions differing from each other in growth mode, that is, a region called a facet region and a region called a non-facet region. It is known that the facet region and the non-facet region differ from each other in physical properties such as electric resistivity and defect density, due to the difference in growth mode. In view of this, for obtaining devices with predetermined performance by use of the SiC wafer manufactured, development of a technology for forming an SiC single crystal ingot while controlling the regions in which the facet region and the non-facet region are formed has been under way (see Japanese Patent Laid-open Nos. 2014-40357, 2004-323348, and 2013-100217).

SUMMARY OF THE INVENTION

The facet region and the non-facet region differ from each other in refractive index. Therefore, when a laser beam of such a wavelength as to be transmitted through SiC is applied to a predetermined depth from the surface of the SiC single crystal ingot to form a modified layer, the laser beam would be focused on different depth positions in the facet region and in the non-facet region. As a result, the modified layer is not formed at a uniform depth, so that a cutting allowance (kerf loss) of a predetermined size is needed even in the case of using a slicing method by a laser beam. In view of this, it is contemplated to conduct irradiation with the laser beam under different laser processing conditions respectively in the facet region and in the non-facet region, such that a modified layer will be formed at a uniform depth inside the SiC single crystal ingot independently from the respective regions. For instance, in the case of an SiC wafer, the facet region and the non-facet region can be discriminated by visual inspection based on the contrast on which the difference in nitrogen concentration between the regions is reflected.

However, in the case of an SiC single crystal ingot which is thicker than the SiC wafer, it is difficult to distinguish the facet region and the non-facet region from each other by visual inspection. Therefore, in the case of an SiC single crystal ingot, it is difficult to recognize the positions of the respective regions and to apply the laser beam to the SiC single crystal ingot under processing conditions suitable for the respective regions.

Accordingly, it is an object of the present invention to provide a detecting method and a detecting apparatus by which a facet region of an SiC single crystal ingot can be easily detected.

In accordance with an aspect of the present invention, there is provided a facet region detecting method for detecting a facet region of an SiC single crystal ingot which has a first surface and a second surface on a side opposite to the first surface and in which a c-axis extends from the first surface to the second surface, the facet region detecting method including: an irradiation step of irradiating the first surface of the SiC single crystal ingot with light from a light source; a fluorescence intensity detecting step of detecting fluorescence generated from the first surface of the SiC single crystal ingot by the light irradiating the first surface therewith, to obtain a distribution of fluorescence intensity; and a determination step of determining a region of the first surface where the fluorescence intensity detected in the fluorescence intensity detecting step is comparatively low as a facet region, and determining a region where the fluorescence intensity is comparatively high as a non-facet region.

Preferably, the facet region detecting method further includes a grinding step of grinding the first surface by use of a grindstone, before carrying out the irradiation step.

In accordance with another aspect of the present invention, there is provided a facet region detecting apparatus for detecting a facet region of an SiC single crystal ingot which has a first surface and a second surface on a side opposite to the first surface and in which a c-axis extends from the first surface to the second surface, the facet region detecting apparatus including: a chuck table that holds the SiC single crystal ingot, with the first surface directed to an upper side; a light source that irradiates the SiC single crystal ingot held by the chuck table with light; a fluorescence detection unit that detects fluorescence generated from the first surface by the light with which the first surface is irradiated from the light source, to obtain a distribution of fluorescence intensity; and a determination unit that detects a position of a facet region of the first surface of the SiC single crystal ingot from the fluorescence intensity distribution detected by the fluorescence detection unit.

Preferably, the fluorescence detection unit includes an imaging unit that images the first surface of the SiC single crystal ingot generating the fluorescence by irradiation with the light from the light source.

When the first surface of the SiC single crystal ingot is irradiated with light of a specific wavelength, fluorescence is generated from the first surface. Since a facet region and a non-facet region differ from each other in optical characteristics, they differ from each other in the intensity of fluorescence generated when irradiation with light is conducted under the same conditions. For instance, the intensity of fluorescence is comparatively low in the facet region, whereas the fluorescence intensity is comparatively high in the non-facet region. In other words, the distribution of intensity of fluorescence generated on the first surface of the SiC single crystal ingot corresponds to the distribution of the facet region and the non-facet region. Taking this into consideration, in the detecting method and detecting apparatus for the facet region according to the described aspect of the present invention, the first surface of the SiC single crystal ingot is irradiated with light, and the fluorescence generated on the first surface is detected. Then, by obtaining the distribution of intensity of fluorescence, the facet region of the SiC single crystal ingot can be detected.

Therefore, according to the present invention, there are provided a detecting method and a detecting apparatus by which a facet region of an SiC single crystal ingot can be easily detected.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
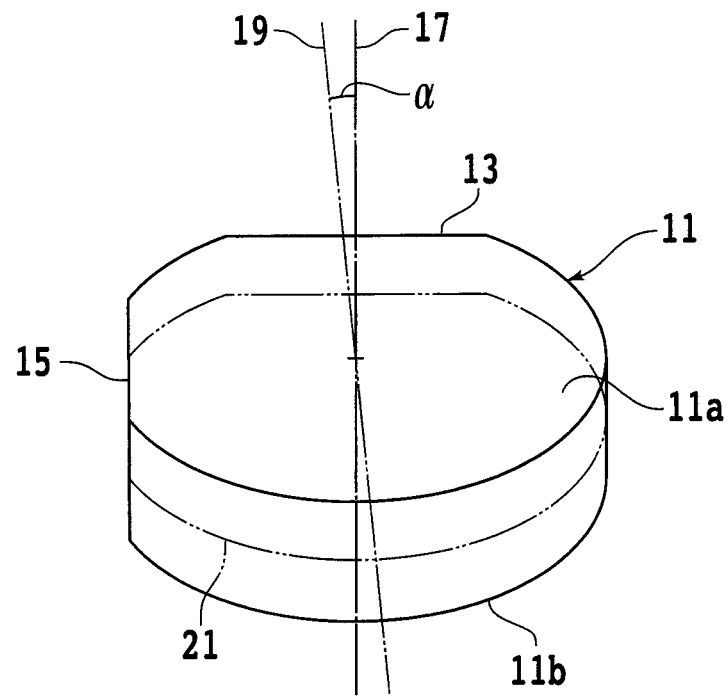
FIG. 1A is a perspective view schematically depicting an SiC single crystal ingot.
Figure 1B:
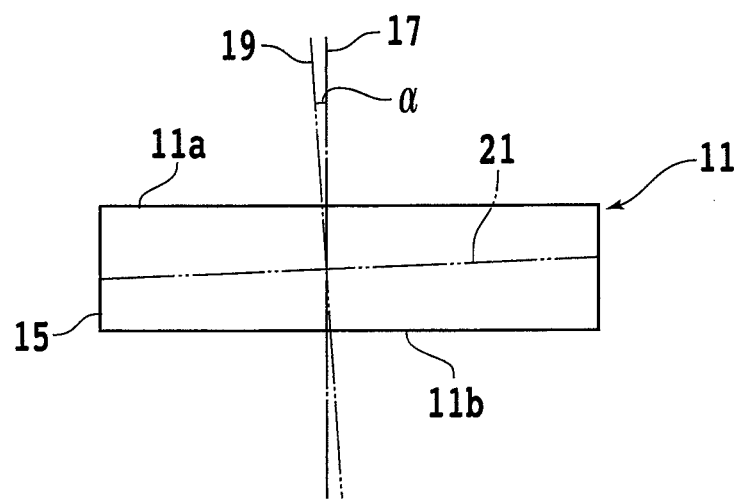
FIG. 1B is a side view schematically depicting an SiC single crystal ingot.

An embodiment of the present invention will be described below, referring to the attached drawings. First, an SiC single crystal ingot of which a facet region is to be detected by a facet region detecting method and detecting apparatus according to the present embodiment will be described. FIG. 1A is a perspective view schematically depicting an SiC single crystal ingot 11, and FIG. 1B is a side view schematically depicting the SiC single crystal ingot 11. The SiC single crystal ingot 11 has a first surface 11a and a second surface 11b on a side opposite to the first surface 11a. The first surface 11a and the second surface 11b are parallel to each other. The SiC single crystal ingot 11 is, for example, split at a split plane parallel to the first surface 11a, and is sliced as an SiC wafer. The SiC wafer is paid attention as a next-generation semiconductor material to be used for manufacture of power devices such as inverters and converters.

At the time of splitting the SiC single crystal ingot 11, for example, a laser beam of such a wavelength as to be transmitted through SiC is focused along a split plane on a position deep by a predetermined distance from the first surface 11a, to form a modified layer inside the SiC single crystal ingot 11 by a multiphoton absorption process. Then, cracks are extended along the split surface from the modified layer, whereby the SiC single crystal ingot 11 is split. Note that since the first surface 11a of the SiC single crystal ingot 11 constitutes a surface to be irradiated with the laser beam, it may be preliminarily polished into a mirror surface.

As illustrated in FIG. 1A, the SiC single crystal ingot 11 is formed with a first orientation flat 13, and a second orientation flat 15 orthogonal to the first orientation flat 13. The length of the first orientation flat 13 is greater than the length of the second orientation flat 15. The SiC single crystal ingot 11 has a c-axis 19 inclined at an off angle α in the direction of the second orientation flat 15 with reference to a normal 17 to the first surface 11a, and a c-plane 21 orthogonal to the c-axis 19. The c-axis 19, for example, extends from the first surface 11a to the second surface 11b. The c-plane 21 is inclined at an off angle α relative to the first surface 11a of the SiC single crystal ingot 11. In general, in the SiC single crystal ingot 11, the direction orthogonal to the extending direction of the shorter second orientation flat 15 is the inclination angle of the c-axis 19. The c-planes 21 are set countlessly on a molecular level in the SiC single crystal ingot 11. The off angle α is set at 4°, for example. However, the off angle α is not limited to 4°, and the SiC single crystal ingot 11 can be manufactured while setting the off angle α freely in the range of, for example, 1° to 6°.

Figure 2A:
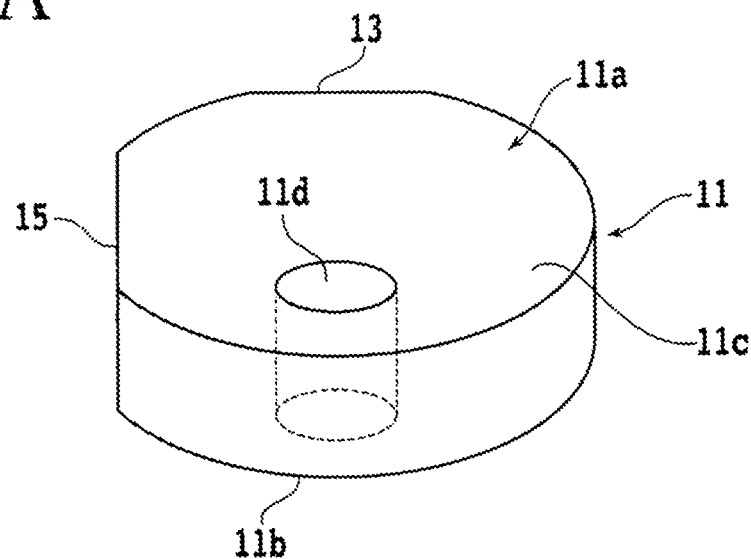
FIG. 2A is a perspective view schematically depicting a facet region of the SiC single crystal ingot.

An SiC single crystal, in its growth process, is formed in its surface with regions different from each other in growth modes, that is, a region called a facet region and a region called a non-facet region. FIG. 2A is a perspective view schematically depicting a facet region 11d and a non-facet region 11c of the SiC single crystal ingot 11. In FIG. 2A, the facet region 11d is illustrated, and the region other than the facet region 11d is the non-facet region 11c. It is known that the facet region 11d and the non-facet region 11c are different from each other in physical properties such as electric resistivity and defect density due to the difference in growth mode. It is to be noted, however, that in the SiC single crystal ingot 11, the facet region 11d and the non-facet region 11c are difficult to distinguish from each other by visual inspection.

The facet region 11d and the non-facet region 11c are different from each other in refractive index. Therefore, at the time of focusing a laser beam of such a wavelength as to be transmitted through SiC on a predetermined depth in the SiC single crystal ingot 11 in order to form a modified layer, the laser beam would be focused on different depth positions in the facet region 11d and in the non-facet region 11c. More specifically, the refractive index of the facet region 11d is greater than the refractive index of the non-facet region 11c. Therefore, in the facet region 11d, the laser beam would be focused on a deeper position, and the modified layer would be formed at a deeper position, than in the non-facet region 11c.

Further, the facet region 11d and the non-facet region 11c are different from each other in absorptivity of laser beam. Although the laser beam has a property of being transmitted through SiC, it is absorbed in SiC in a predetermined proportion. The laser beam absorptivity in the non-facet region 11c is lower than the laser beam absorptivity in the facet region 11d. Therefore, the intensity of the laser beam reaching the focal point is stronger in the non-facet region 11c than in the facet region 11d.

Specifically, even when the whole surface of the first surface 11a of the SiC single crystal ingot 11 is irradiated with a laser beam under the same conditions, a modified layer is not formed uniformly at a uniform depth in the inside of the SiC single crystal ingot 11. Therefore, the cutting allowance (kerf loss) at the time of slicing an SiC wafer is enlarged. In view of this, in the facet region detecting method and detecting apparatus according to the present embodiment, the position of the facet region 11d in the SiC single crystal ingot 11 is detected. When the positions of the facet region 11d and the non-facet region 11c are detected, the respective regions can be irradiated with the laser beam under different conditions such that the modified layer will be formed uniformly in the respective regions.

Figure 2B:
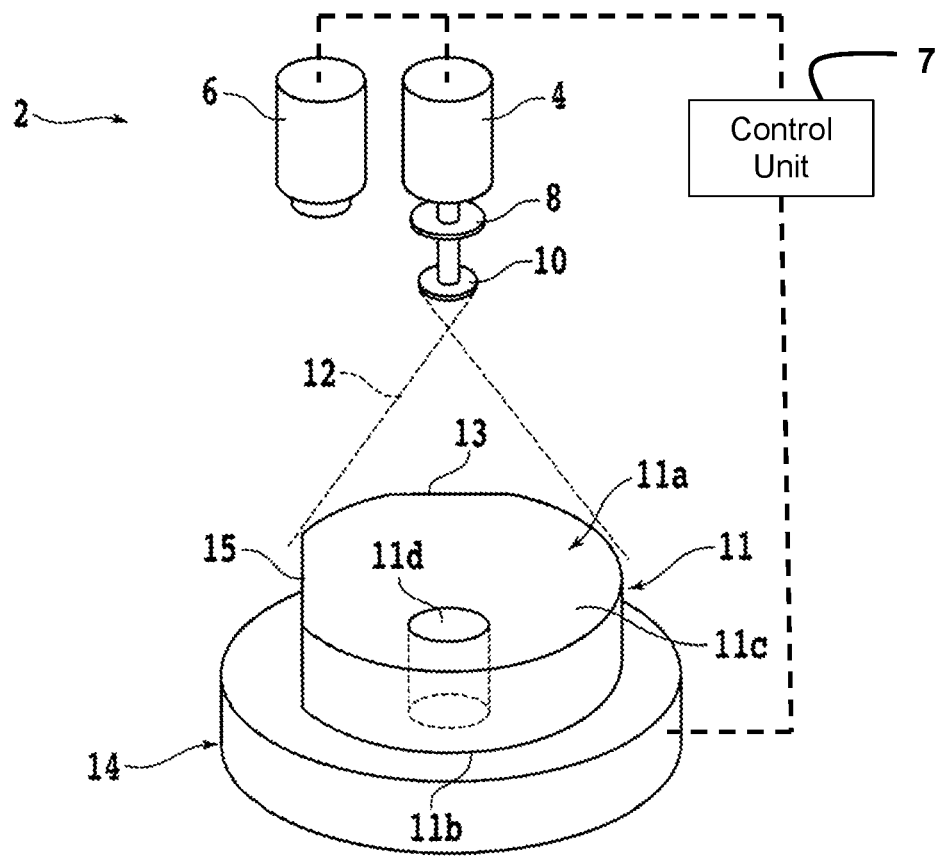
FIG. 2B is a perspective view schematically depicting an irradiation step and a fluorescence intensity detection step.

The detecting apparatus for the facet region 11d according to the present embodiment will be described below. FIG. 2B schematically depicts a main configuration of the detecting apparatus 2 for the facet region 11d. The detecting apparatus 2 includes a chuck table 14 by which the SiC single crystal ingot 11 is held, and a light source unit 4 disposed on an upper side of the chuck table 14. The detecting apparatus 2 further includes, for example, an imaging unit 6 aligned with the light source unit 4.

The chuck table 14 is provided therein with a suction passage (not illustrated) of which one end communicates with an upper surface of the chuck table 14, and a suction source (not illustrated) connected to the other end of the suction passage. When the SiC single crystal ingot 11 is placed on the upper surface of the chuck table 14 and the suction source is operated to cause a negative pressure to act on the SiC single crystal ingot 11 through the suction passage, the SiC single crystal ingot 11 is suction held onto the chuck table 14. In other words, the upper surface of the chuck table 14 serves as a holding surface.

The light source unit 4 includes a light source (not illustrated) in the inside thereof. The light source is, for example, a mercury lamp or a light emitting diode (LED), and is able to emit light including a wavelength component in the ultraviolet (UV) region. The light source unit 4 further includes a filter 8 such as a band-pass filter permitting transmission therethrough of light of a specified wavelength, and a lens 10 for adjusting the region of irradiation with the light. The light 12 emitted from the light source is transmitted through the filter 8. In this instance, components other than the predetermined wavelength, of the light 12, are shielded. Thereafter, the light 12 passes through the lens 10 to irradiate therewith the SiC single crystal ingot 11 held by the chuck table 14. The light 12 with which the SiC single crystal ingot 11 is irradiated is light of such a wavelength as to generate fluorescence when the SiC single crystal ingot 11 is irradiated therewith, and the light 12 is UV rays of a wavelength of 365 nm, for example.

The imaging unit 6 is directed toward the holding surface of the chuck table 14, and images fluorescence generated when the SiC single crystal ingot 11 held by the chuck table 14 is irradiated with the light 12 from the light source, to obtain a fluorescent image of the first surface 11a. Thus, the detecting apparatus 2 includes a fluorescence detection unit including the imaging unit 6. The imaging unit 6 may be a camera or other imaging device that detects intensity of the fluorescence of an object. Here, the fluorescent image is an image in which a distribution of intensity of fluorescence appears. Note that the imaging unit 6 may be disposed side by side in the vicinity of the light source unit 4, or may be disposed on an oblique upper side of the chuck table 14.

The detecting apparatus 2 for the facet region 11d further includes a control unit shown in FIG. 2B, where the control unit controls the components of the detecting apparatus 2. The control unit may be a computer, a processor or other controller. The control unit is electrically connected to the chuck table 14, the light source unit 4, and the imaging unit 6. The control unit controls the light source unit 4 to irradiate the SiC single crystal ingot 11 held by the chuck table 14 with the light 12, and causes the imaging unit 6 to detect the fluorescence and to form the fluorescent image.

Note that the control unit may move the chuck table 14 in a direction parallel to the holding surface while irradiating part of the first surface 11a of the SiC single crystal ingot 11 with the light 12 by controlling the light source unit 4, to scan the light 12 across the first surface 11a. In this case, the control unit correlates the coordinates of the position of irradiation of the first surface 11a with the light 12 and the intensity of fluorescence detected by the imaging unit 6, thereby to form a fluorescent image. The control unit of the detecting apparatus 2 for the facet region 11d may include a recording unit that records the fluorescent image formed based on the fluorescence detected. In addition, the control unit may include a determination unit that determines the position of the facet region 11d in the first surface 11a of the SiC single crystal ingot 11, from the distribution of intensity of fluorescence appearing in the fluorescent image.

The fluorescence generated on the first surface 11a of the SiC single crystal ingot 11 differs in intensity between the facet region 11d and the non-facet region 11c. Therefore, the fluorescent image recorded in the recording unit is a fluorescent image differing in fluorescence intensity according to the positions of the facet region 11d and the non-facet region 11c. For example, in the facet region 11d, the intensity of fluorescence is lower as compared to the non-facet region 11c. In view of this, the determination unit of the control unit determines a region where the fluorescence intensity in the fluorescent image is comparatively low as the facet region 11d, and determines a region where the fluorescence intensity is comparatively high as the non-facet region 11c. In this way, the detecting apparatus 2 for the facet region 11d can detect the position of the facet region 11d in the first surface 11a of the SiC single crystal ingot 11 from the distribution of intensity of fluorescence generated upon irradiation of the SiC single crystal ingot 11 with the light 12. Note that the control unit may include a storage section that stores information on the position of the facet region 11d of the SiC single crystal ingot 11 detected. Besides, the control unit may transmits the information on the position of the facet region 11d to a laser processing apparatus which slices the SiC single crystal ingot 11 into an SiC wafer.

Figure 5:
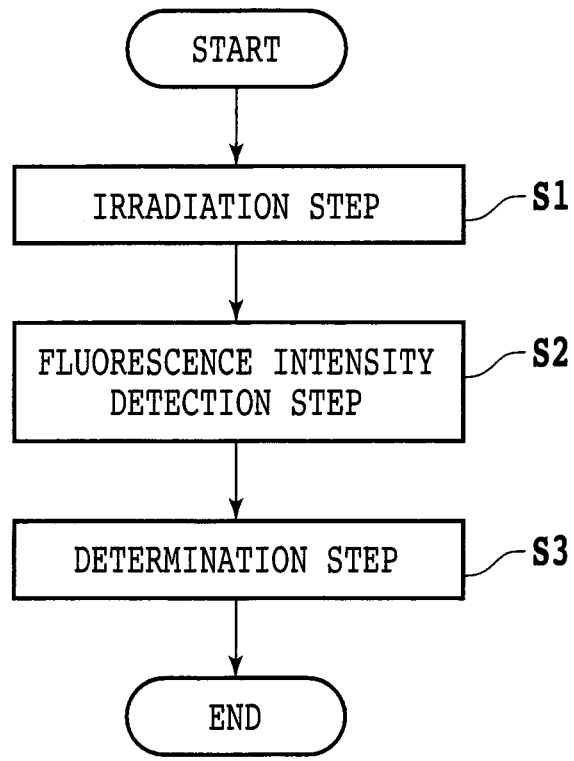
FIG. 5 is a flow chart depicting the flow of steps of a facet region detecting method.

The facet region detecting method according to the present embodiment which is carried out using the detecting apparatus 2 for the facet region 11d will be described below. FIG. 5 is a flow chart schematically depicting the flow of steps of the facet region detecting method.

In the detecting method for the facet region 11d, first, an irradiation step S1 is performed in which the first surface 11a of the SiC single crystal ingot 11 is irradiated with the light 12 from the light source of the light source unit 4. FIG. 2B is a perspective view schematically depicting the irradiation step S1. In the irradiation step S1, the SiC single crystal ingot 11 is placed on the upper surface of the chuck table 14, with the first surface 11a directed to the upper side. Then, the suction source in the chuck table 14 is operated to cause a negative pressure to act on the SiC single crystal ingot 11, whereby the SiC single crystal ingot 11 is suction held onto the chuck table 14. Next, the light source unit 4 is operated to emit the light 12 from the light source, and the first surface 11a is irradiated with the light 12 through the filter 8 and the lens 10. The light 12 is light of a wavelength shorter than or equal to the UV region that generates fluorescence from the SiC single crystal ingot 11 upon irradiation of the SiC single crystal ingot 11 therewith; for example, the light 12 is light of a wavelength of 365 nm. It is to be noted, however, that the wavelength of the light 12 is not limited to this.

Figure 3:
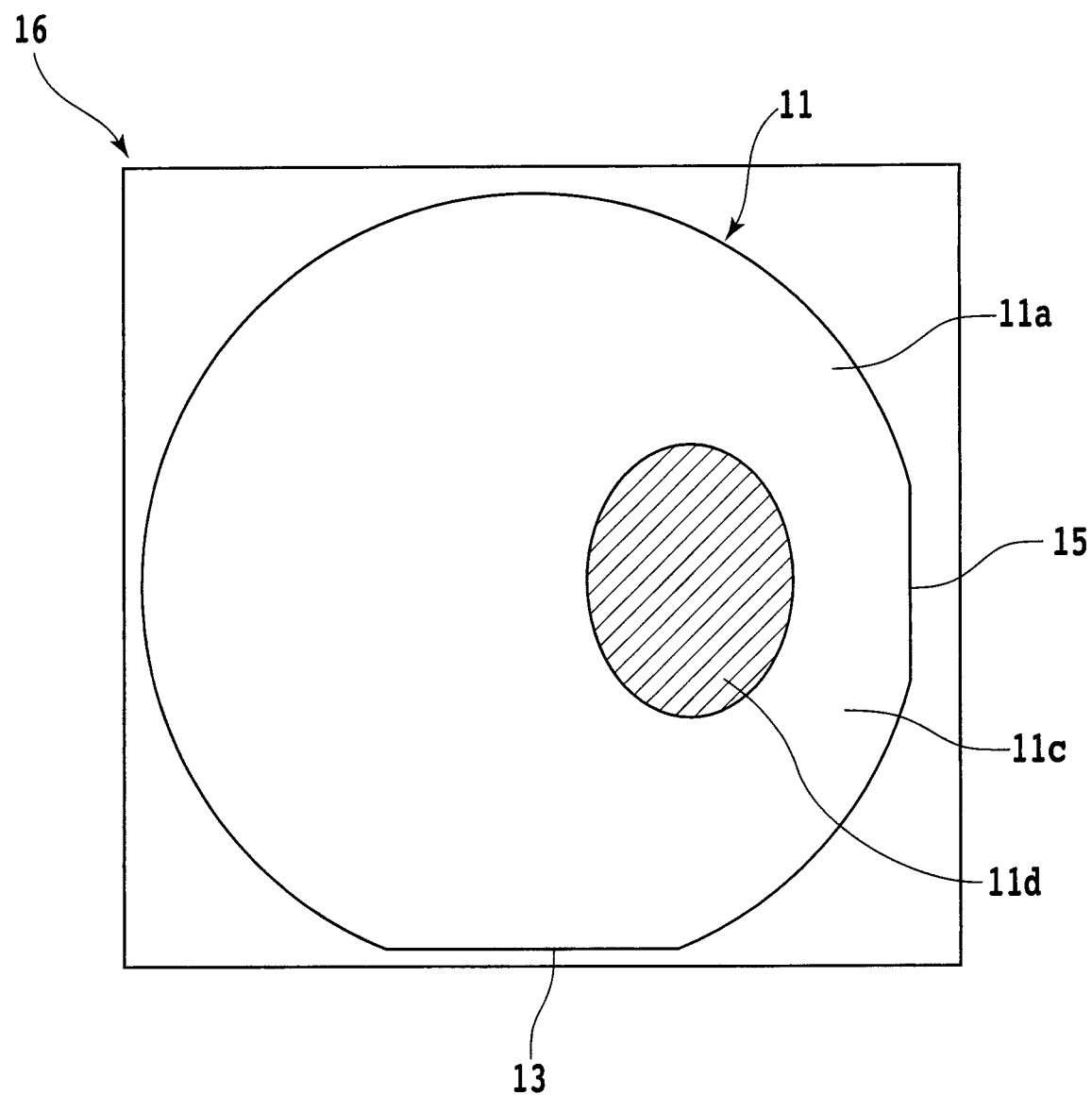
FIG. 3 is a plan view schematically depicting an example of a fluorescent light image picked up by an imaging unit.

In the detecting method for the facet region 11d according to the present embodiment, next, a fluorescence intensity detection step S2 is conducted in which fluorescence generated from the first surface 11a of the SiC single crystal ingot 11 by irradiation of the first surface 11a with the light 12 is detected, to obtain a distribution of intensity of the fluorescence. The fluorescence generated by the light 12 with which the first surface 11a is irradiated in the irradiation step S1 is detected by the imaging unit 6 constituting the fluorescence detection unit. FIG. 3 is a plan view schematically depicting a fluorescent image 16 of the first surface 11a on which the distribution of intensity of fluorescence detected by the imaging unit 6 in the fluorescence intensity detection step S2 is reflected. In the plan view of FIG. 3, for convenience of explanation, a region where fluorescence intensity is comparatively low is hatched with slant lines. As depicted in FIG. 3, in the fluorescent image 16, a region where the intensity of fluorescence generated is comparatively high and a region where the intensity is comparatively low are recognized in the first surface 11a of the SiC single crystal ingot 11.

Subsequently, in the detecting method for the facet region 11d according to the present embodiment, a determination step S3 is performed in which the positions of the facet region 11d and the non-facet region 11c in the first surface 11a are determined from the fluorescent image 16 obtained in the fluorescence intensity detection step S2. In the determination step S3, on the first surface 11a of the SiC single crystal ingot 11, the region where the fluorescence intensity is comparatively low is determined as the facet region 11d, whereas the region where the fluorescence intensity is comparatively high is determined as the non-facet region 11c. According to the detecting method for the facet region 11d of the present embodiment, the facet region 11d and the non-facet region 11c can be detected by detecting the fluorescence generated upon irradiation of the SiC single crystal ingot 11 with the light 12.

Note that in the detecting method for the facet region 11d according to the present embodiment, a grinding step of grinding the first surface 11a of the SiC single crystal ingot 11 by use of a grindstone may be carried out before performing the irradiation step S1. In the irradiation step S1, the first surface 11a is irradiated with the light 12, and the resultant fluorescence is observed. In this instance, if the surface of the first surface 11a is not flat, regions of the first surface 11a are not irradiated with the light 12 under uniform conditions, and fluorescence is not generated in the same conditions. Therefore, for appropriate detection of the facet region 11d, it is preferable to carry out the grinding step to grind the first surface 11a, thereby obtaining a mirror surface. In addition, when the grinding step is conducted and the first surface 11a is flat, the whole region of the first surface 11a can be laser processed under desired conditions, at the time of slicing an SiC wafer from the SiC single crystal ingot 11 thereafter.

Further, in the detecting method for the facet region 11d according to the present embodiment, a storage step may be carried out in which information on the positions of the facet region 11d and the non-facet region 11c detected in the determination step S3 is stored into a storage section of the control unit. The SiC wafer may be manufactured from the SiC single crystal ingot 11 later, by use of the information on the positions of the facet region 11d and the non-facet region 11c stored in the storage step. At the time of manufacturing the SiC wafer, when the SiC single crystal ingot is irradiated with a laser beam to be transmitted through SiC under conditions respectively suitable for the facet region 11d and the non-facet region 11c, a uniform modified layer can be formed at a predetermined depth position in the SiC single crystal ingot. In this case, the cutting allowance necessary at the time of forming the SiC wafer by slicing the SiC single crystal ingot is made to be comparatively small, and a loss factor of SiC is lowered, so that the SiC wafers can be manufactured efficiently.

Figure 4A:
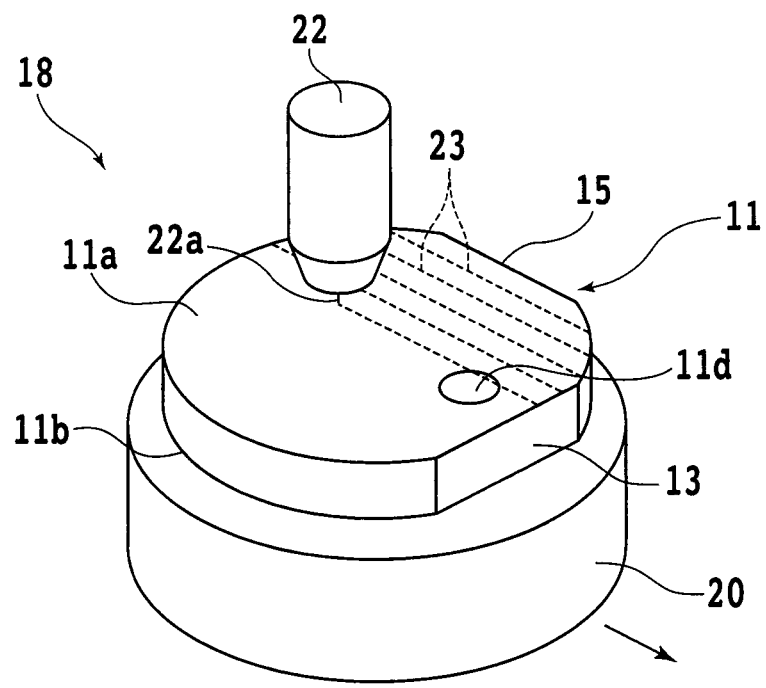
FIG. 4A is a perspective view schematically depicting a laser processing step.

A method of manufacturing an SiC wafer by laser processing the SiC single crystal ingot 11 of which the facet region 11d and the non-facet region 11c have been detected and the laser processing apparatus will be described below. FIG. 4A is a perspective view schematically depicting a manner in which the SiC single crystal ingot 11 is laser processed by the laser processing apparatus.

The laser processing apparatus 18 illustrated in FIG. 4A includes a chuck table 20, and a laser processing unit 22 on an upper side of the chuck table 20. The chuck table 20 is configured in a similar manner to the chuck table 14 of the detecting apparatus 2 for the facet region 11d. The chuck table 20 can be moved in a direction parallel to a holding surface, or an upper surface thereof. The laser processing unit 22 has a function of focusing a laser beam 22a of such a wavelength as to be transmitted through SiC on a predetermined depth position in the SiC single crystal ingot 11 held by the chuck table 14. The laser beam 22a is focused on a depth position of a split plane of the SiC single crystal ingot 11.

In the method of manufacturing the SiC wafer, first, a holding step of holding the SiC single crystal ingot 11 is performed. In the holding step, the SiC single crystal ingot 11 is placed on the holding surface of the chuck table 20 of the laser processing apparatus 18, with the first surface 11a directed to the upper side, and the SiC single crystal ingot 11 is suction held by the chuck table 20.

Next, a laser processing step is conducted in which the SiC single crystal ingot 11 is irradiated with the laser beam 22a to laser process the SiC single crystal ingot. In the laser processing step, the laser processing unit 22 is operated to put the chuck table 20 into processing feeding in a direction parallel to the holding surface while focusing the laser beam 22a on a predetermined depth in the inside of the SiC single crystal ingot 11. For example, as depicted in FIG. 4A, the chuck table 20 is put to processing feeding in a direction along the second orientation flat 15 of the SiC single crystal ingot 11. When the laser beam 22a is focused on a predetermined depth position in the inside of the SiC single crystal ingot 11, a modified layer 23 is formed in the vicinity of the focal point by a multiphoton absorption process. The laser beam 22a is focused on from one end to the other end of the SiC single crystal ingot 11, after which the chuck table 20 is put to indexing feeding in a direction parallel to the holding surface of the chuck table 20 and perpendicular to the second orientation flat 15. Thereafter, while putting the chuck table 20 to processing feeding in the reverse direction along the second orientation flat 15, the laser beam 22a is focused on the SiC single crystal ingot 11.

Figure 4B:
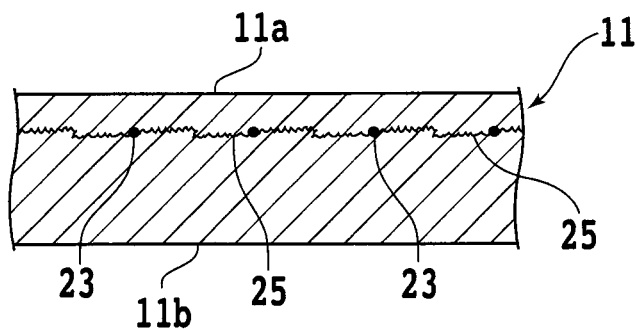
FIG. 4B is a sectional view schematically depicting the SiC single crystal ingot formed with modified layers and cracks.
Figure 4C:
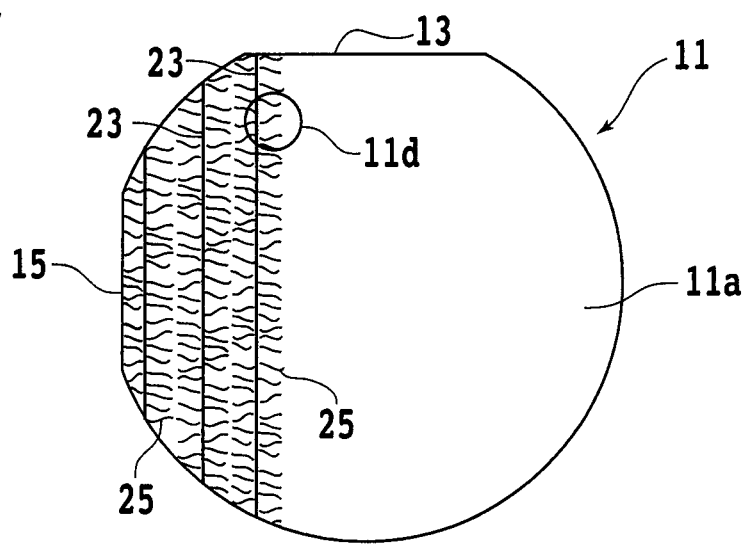
FIG. 4C is a top plan view schematically depicting the SiC single crystal ingot formed with the modified layers and the cracks.

When the modified layers 23 are formed by irradiation with the laser beam 22a, cracks 25 extend along the split plane from the modified layers 23. FIG. 4B is a sectional view schematically depicting the manner in which the cracks 25 extend from the modified layers 23. As illustrated in FIG. 4B, the cracks 25 are liable to extend in a direction along the c-plane 21 (see FIG. 1A, etc.) from the modified layers 23. In addition, FIG. 4C is a top plan view schematically depicting the manner in which the cracks 25 extend from the modified layers 23 formed. Note that while the modified layers 23 and the cracks 25 do not appear to the first surface 11a of the SiC single crystal ingot 11, they are drawn in solid lines in FIG. 4C, for convenience of explanation. Then, the whole surface of the first surface 11a of the SiC single crystal ingot 11 is irradiated with the laser beam 22a. As a result, the SiC single crystal ingot 11 is split due to the cracks formed along the split plane, whereby the SiC wafer is formed.

Note that when the irradiation with the laser beam 22a in the laser processing step is conducted under the same conditions for the whole region along the first surface 11a, the depth of the modified layers 23 formed and the degree of extension of the cracks 25 differ between the facet region 11d and the non-facet region 11c. In view of this, the laser processing is carried out under different conditions in the facet region 11d and in the non-facet region 11c. In this instance, the processing conditions in the respective regions are set in such a manner that the modified layers 23 and the cracks 25 will be formed in a similar manner in the respective regions. Here, according to the detecting method and the detecting apparatus for the facet region 11d of the present embodiment, the positions of the facet region 11d and the non-facet region 11c of the SiC single crystal ingot 11 can be preliminarily detected before carrying out the laser processing. Besides, the laser processing apparatus 18 is able to acquire the information on the position of the facet region 11d from the detecting apparatus 2 for the facet region 11d. Therefore, at the time of performing the laser processing, the laser processing can be carried out under processing conditions respectively suitable for the respective regions, that is, the facet region 11d and the non-facet region 11c.

For example, at the time of processing the non-facet region 11c, irradiation with the laser beam 22a is conducted under the processing conditions suitable for the non-facet region 11c. Then, at the time when the focal point of the laser beam 22a is reaching the facet region 11d, the processing conditions are changed over, and irradiation with the laser beam 22a is conducted. At the time when the focal point of the laser beam 22a is again reaching the non-facet region 11c, the processing conditions are returned to the original, and irradiation with the laser beam 22a is performed. Alternatively, the chuck table 20 is moved, and the non-facet region 11c is laser processed under conditions suitable for the non-facet region 11c. Then, when the focal point of the laser beam 22a is reaching the facet region 11d, irradiation with the laser beam 22a is stopped. Thereafter, when the focal point is leaving the facet region 11d, irradiation with the laser beam 22a is restarted. Next, the chuck table 20 is moved in the reverse direction, and, when the focal point of the laser beam 22a is reaching the facet region 11d, irradiation with the laser beam 22a is conducted, to process the facet region 11d under conditions suitable for the facet region 11d.

In these cases, the modified layers can be formed uniformly at a predetermined depth position in the SiC single crystal ingot 11. Therefore, variability in the depth position at which the SiC single crystal ingot 11 is split and the like is reduced. Accordingly, the cutting allowance of the SiC single crystal ingot 11 needed in consideration of this variability can be set small. Therefore, at the time of forming the SiC wafers from the SiC single crystal ingot 11, the loss amount of SiC can be reduced.

Note that the present invention is not limited to the description of the embodiment above, and can be carried out with various modifications. For instance, a case where the SiC single crystal ingot 11 is held by the chuck table 14, the first surface 11a is irradiated with the light, and the resulting fluorescence is detected has been described in the above embodiment, but a mode of the present invention is not limited to this. For example, at the time of irradiation with the light, the SiC single crystal ingot 11 may not be held by the chuck table 14, and the SiC single crystal ingot 11 may be placed on a table which does not have a suction holding mechanism. In addition, the detecting apparatus 2 for the facet region 11d may be incorporated in the laser processing apparatus 18 that slices the SiC wafer from the SiC single crystal ingot 11. In this case, the SiC single crystal ingot 11 having undergone detection of the position of the facet region 11d is laser processed as it is, whereby the SiC wafer is sliced therefrom. In this case, the chuck table 20 of the laser processing apparatus 18 may function as the chuck table 14 of the detecting apparatus 2, and the laser processing unit 22 of the laser processing apparatus 18 may function as the light source unit 4 of the detecting apparatus 2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A facet region detecting method for detecting a facet region of a silicon carbide (SIC) single crystal ingot which has a first surface and a second surface on a side opposite to the first surface and in which a c-axis extends from the first surface to the second surface, the facet region detecting method comprising:
   an irradiation step of irradiating the first surface of the SiC single crystal ingot with light from a light source;
   a fluorescence intensity detecting step of detecting fluorescence generated from the first surface of the SiC single crystal ingot by the light irradiating the first surface therewith, to obtain a distribution of fluorescence intensity; and
   a determination step of determining a region of the first surface where the fluorescence intensity detected in the fluorescence intensity detecting step is comparatively low as a facet region, and determining a region where the fluorescence intensity is comparatively high as a non-facet region.

2. The facet region detecting method according to claim 1, further comprising:
   a grinding step of grinding the first surface by use of a grindstone, before carrying out the irradiation step.

3. The facet region detecting method according to claim 1, further comprising a storage step of storing position information related to the facet region and the non-facet region based on the fluorescence intensity detected in the fluorescence intensity detecting step.

4. The facet region detecting method according to claim 1, further comprising a filtering step of filtering the light emitted by the light source using a band-pass filter to emit light of a specified wavelength.

5. A facet region detecting apparatus for detecting a facet region of a silicon carbide (SIC) single crystal ingot which has a first surface and a second surface on a side opposite to the first surface and in which a c-axis extends from the first surface to the second surface, the facet region detecting apparatus comprising:

a chuck table that holds the SiC single crystal ingot, with the first surface directed to an upper side;

a light source that irradiates the SiC single crystal ingot held by the chuck table with light;

a fluorescence detection unit includes an imaging unit that images the first surface of the SiC single crystal ingot generating fluorescence by irradiation with the light from the light source to detect fluorescence generated from the first surface by the light with which the first surface is irradiated from the light source, to obtain a distribution of fluorescence intensity; and a control unit including a determination unit that detects a position of a facet region of the first surface of the SiC single crystal ingot from the fluorescence intensity distribution detected by the fluorescence detection unit.

6. The facet region detecting apparatus according to claim 5, wherein the control unit includes a storage section that stores position information related to the facet region and the non-facet region based on the fluorescence intensity detected by the fluorescence detection unit.

7. The facet region detecting apparatus according to claim 5, wherein the light source includes a band-pass filter that filters the light emitted by the light source to emit light of a specified wavelength.

8. The facet region detecting apparatus according to claim 5, further comprising a grindstone that grinds the first surface of the ingot, before irradiating the ingot with light.

* * * * *